(12) United States Patent
Dai et al.

(10) Patent No.: US 7,183,228 B1
(45) Date of Patent: Feb. 27, 2007

(54) CARBON NANOTUBE GROWTH

(75) Inventors: Hongjie Dai, Sunnyvale, CA (US); Nathan R. Franklin, Goleta, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 10/285,311

(22) Filed: Oct. 31, 2002

Related U.S. Application Data

(60) Provisional application No. 60/335,396, filed on Nov. 1, 2001.

(51) Int. Cl.
*H01L 21/31* (2006.01)

(52) U.S. Cl. .................... 438/780; 977/843

(58) Field of Classification Search ........ 438/780–781; 977/843
See application file for complete search history.

(56) References Cited

U.S. PATENT DOCUMENTS

| | | | |
|---|---|---|---|
| 4,145,803 A * | 3/1979 | Tasch, Jr. .................... 438/250 |
| 4,495,793 A | 1/1985 | Hager | |
| 5,334,351 A | 8/1994 | Heinze et al. | |
| 5,436,167 A | 7/1995 | Robillard | |
| 5,448,906 A | 9/1995 | Cheung | |
| 5,482,601 A | 1/1996 | Ohshima et al. | |
| 5,500,200 A | 3/1996 | Mandeville et al. | |
| 5,547,748 A | 8/1996 | Ruoff et al. | |
| 5,571,395 A | 11/1996 | Park et al. | |
| 5,626,650 A | 5/1997 | Rodriguez et al. | |
| 5,643,670 A | 7/1997 | Chung | |
| 5,650,370 A | 7/1997 | Tennent et al. | |
| 5,653,951 A | 8/1997 | Rodriguez et al. | |
| 5,690,997 A | 11/1997 | Grow | |
| 5,707,916 A | 1/1998 | Snyder et al. | |
| 5,726,116 A | 3/1998 | Moy et al. | |
| 5,726,524 A | 3/1998 | Debe | |
| 5,780,101 A | 7/1998 | Nolan et al. | |
| 5,830,326 A | 11/1998 | Iijima | |

(Continued)

FOREIGN PATENT DOCUMENTS

| | | |
|---|---|---|
| EP | 913 508 A2 | 2/1998 |
| WO | 9510481 | 4/1995 |
| WO | 9805920 | 2/1998 |

OTHER PUBLICATIONS

Wolf et al., "Silicon Processing for the VLSI Era vol. 1: Process Technology", p. 518, Lattice Press, 1986.*

(Continued)

*Primary Examiner*—Richard A. Booth
(74) *Attorney, Agent, or Firm*—Crawford Maunu PLLC

(57) ABSTRACT

Patterned growth of arrays of SWNTs is achieved at the full-wafer scale. According to an example embodiment of the present invention, the chemistry of $CH_4$ CVD has been discovered to be sensitive to the concentration of $H_2$, leading to three regimes of growth conditions. The three regimes are identified for particular growth conditions and a regime that facilitates carbon nanotube growth while inhibiting pyrolysis is identified and used during CVD growth of the nanotubes. This approach is also useful for CVD synthesis of other nanomaterials. In this manner, patterned growth of carbon nanotubes is facilitated while inhibiting undesirable conditions, making nanotube orientation control and device integration possible on a large scale.

26 Claims, 3 Drawing Sheets

U.S. PATENT DOCUMENTS

| | | | |
|---|---|---|---|
| 5,866,434 | A | 2/1999 | Massey et al. |
| 5,872,422 | A | 2/1999 | Xu et al. |
| 5,891,395 | A | 4/1999 | Glaunsinger et al. |
| 5,973,444 | A * | 10/1999 | Xu et al. ............... 313/309 |
| 6,012,327 | A | 1/2000 | Seth et al. |
| 6,105,417 | A | 8/2000 | Nosaka et al. |
| 6,156,256 | A * | 12/2000 | Kennel ............... 264/461 |
| 6,159,742 | A | 12/2000 | Lieber et al. |
| 6,162,926 | A | 12/2000 | Murphy et al. |
| 6,346,189 | B1 | 2/2002 | Dai et al. |
| 2003/0089606 | A1 * | 5/2003 | Parce et al. ............ 204/450 |

OTHER PUBLICATIONS

Papadopoulos et al., "Highly-ordered carbon nanotube arrays for electronics applications", Applied Physics Letters, vol. 45, Jul. 19, 1999, pp. 367-369.*

Chen, R.J. "Molecular photodesorption from single-walled carbon nanotubes" Applied Physics Letters, Oct. 2001, vol. 79, No. 14, pp. 2258-2260.

Koshio, A. et al, "In situ laser-furnance TOF mass spectrometry of C36 and the large-scale production by arc-discharge" J. Phys. Chem. B, Jul. 2000, vol. 104, pp. 7908-7913, especially pp. 7908-7909.

Jing Kong, Nathan R. Franklin, Chongwu Zhoum, Michael G. Chapline, Shu Peng, Kyeongjae Cho, and Hongjie Dai, *Nanotube Molecular Wires as Chemical Sensors*, Science vol. 287, pp. 622-625, www.sciencemag.org, Jan. 28, 2000.

Hongjie Dai, *Integrated Nanotube-Electronic Noses and Bio-Chips (DNA Chips & Protein Chips)*, pp. 1-7, Aug. 26, 2001.

Dai, H., "Nanotubes as nanoprobes in scanning probe microscopy," Nature, vol. 384, Nov. 14, 1996, pp. 147-149.

Dagani, "Much Ado About Nanotubes", C&E News, Jan. 11, 1999, pp. 31-34.

* cited by examiner

CARBON NANOTUBE GROWTH

RELATED PATENT DOCUMENTS

This is a continuation of U.S. Provisional Patent Application Ser. No. 60/335,396 filed on Nov. 1, 2001 and entitled "Patterned Growth of Single-walled Carbon Nanotubes on Wafers," to which priority is claimed under 35 U.S.C. §120.

This invention was made with Government support under 9871947 awarded by the National Science Foundation. The Government has certain rights in this invention.

FIELD OF THE INVENTION

The present invention relates generally to carbon nanotubes and more particularly to the growth of carbon nanotubes on a wafer scale.

BACKGROUND

Carbon and carbon-containing nanotubes are unique carbon-based, molecular structures that exhibit interesting and useful electrical properties. There are two general types of carbon nanotubes, referred to as multi-walled carbon nanotubes (MWNTs) and single-walled carbon nanotubes (SWNTs). SWNTs have a cylindrical sheet-like, one-atom-thick shell of hexagonally-arranged carbon atoms, and MWNTs are typically composed of multiple coaxial cylinders of ever-increasing diameter about a common axis. Thus, SWNTs can be considered to be the structure underlying MWNTs and also carbon nanotube ropes, which are uniquely-arranged arrays of SWNTs.

SWNTs are ideal quantum systems for exploring basic science in one-dimension. These novel molecular-scale SWNTs, derived by bottom-up chemical synthesis approaches, are also promising as core components or interconnecting wires for electronics and other applications. Rich quantum phenomena have been revealed with SWNTs and functional electronic devices such as transistors, chemical sensors and memory devices have been built. From both fundamental and practical points of views, it is useful to assemble nanotubes into ordered structures on large surfaces for addressable and integrated devices. Not only is it desirable to place nanotubes at specific locations with desired orientations, it is also desirable to scale such methods to large areas for the large-scale manufacture of nanotubes.

Patterned growth of carbon nanotubes (e.g., by chemical vapor deposition (CVD)) represents an assembly approach for placing and orienting nanotubes at a stage as early as the synthesis stage of the nanotube growth. Catalyst patterning on a substrate can be used to define the locations from which nanotubes originate, with van der Waals forces and/or influences determining the orientation of the nanotubes as they are grown. This approach has been successful in yielding nanotubes, including SWNTs, on small substrates for basic studies and device demonstrations; however, it is not necessarily applicable for surface catalytic patterning in large-scale implementations due to difficulties observed with nanotube growth. For instance, manufacturing difficulties can result in pyrolysis and/or low nanotube yield (e.g., low percentage of successful growth from catalyst growth sites). These and other factors have presented challenges to the large-scale production of carbon nanotubes, such as large arrays of nanotubes on full four-inch wafers.

SUMMARY OF THE INVENTION

The present invention is directed to the fabrication of carbon nanotubes on wafers. The present invention is exemplified in a number of implementations and applications, some of which are summarized below.

According to an example embodiment of the present invention, a plurality of carbon nanotubes are grown using a carbon-containing gas and an amount of $H_2$ such that the carbon-containing gas reacts to grow the carbon nanotubes while adverse growth conditions, such as pyrolysis and others, are inhibited. With this approach, large-scale nanotube production can be realized with relatively high yield and low pyrolysis, addressing issues including those discussed in the background above.

In a more particular example embodiment, the nanotubes are grown from an array of catalyst particles that are patterned on a wafer. The carbon-containing gas and $H_2$ are introduced to the wafer, with the amount of $H_2$ being selected for maintaining the reactivity of the carbon-containing gas for growing carbon nanotubes while inhibiting pyrolysis of the carbon in the carbon-containing gas. An array of carbon nanotubes is thus grown extending from the array of catalyst particles patterned on the wafer.

In another example embodiment, carbon nanotubes are grown in a manner similar to that discussed in the example above. A semiconductor wafer is coated with a layer of photosensitive material susceptible to removal via photoexposure. An array of regions of the photosensitive material are then exposed through a mask and developed to remove portions of the photosensitive material and form an array of wells therein. Catalyst material is then formed in the wells, and the wafer is baked. After baking, the wafer is immersed in a solvent and at least a portion of the photosensitive material is removed.

In another example embodiment of the present invention, a growth regime for nanotube growth is identified using an approach including incrementally adding $H_2$ while monitoring the nanotube growth response. A carbon-containing gas and $H_2$ are introduced to patterned catalyst material on a wafer, and carbon is grown from the patterned catalyst. The $H_2$ is introduced at a selected flowrate, which is incremented slowly while carbon growth on the wafer is monitored. In response to the monitored carbon growth, a growth-regime $H_2$ flowrate range that achieves carbon growth while inhibiting carbon pyrolysis is identified.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention that follows in connection with the accompanying drawings, in which.

Figure 1A:
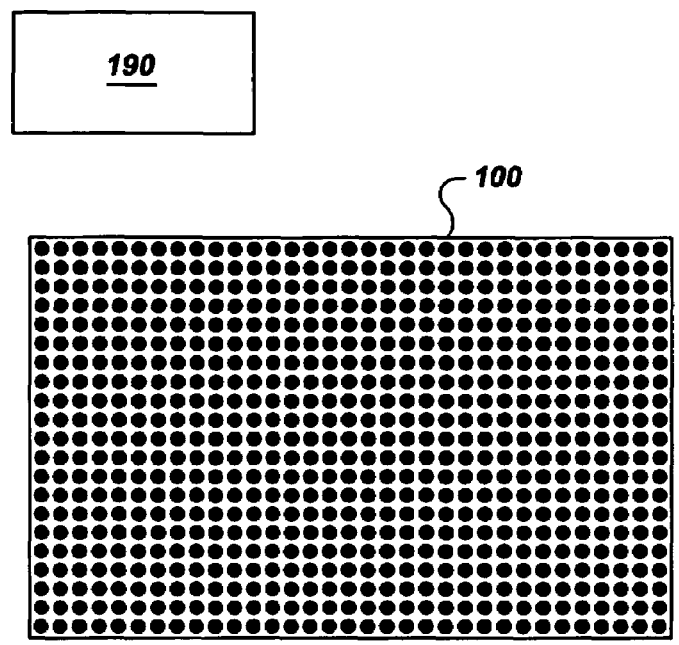
FIG. 1A is an array of catalyst islands on a wafer adapted for making carbon nanotubes on a wafer scale, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be applicable to a variety of different devices and implementations, and the invention has been found to be particularly suited for manufacturing carbon nanotubes on a wafer. While the present invention is not necessarily limited to such applications, various aspects of the invention may be appreciated through a discussion of various examples using this context.

According to an example embodiment of the present invention, patterned, individually addressable carbon nanotubes are grown from catalyst islands on a wafer using chemical vapor deposition (CVD). The CVD is carried out using a first carbon-containing gas that provides the carbon used for growing the nanotubes and a second co-flow gas that inhibits pyrolysis of the carbon (e.g., chemical changes caused by heat, such as the generation of high-hydrocarbons). The carbon-containing gas may, for example, include one or more of a variety of gasses having the composition $C_nH_m$, where n and m are integers, such as methane. A composition and amount of co-flow gas for a particular application is selected for inhibiting pyrolysis while achieving nanotube growth in wafer-scale nanotube fabrication. In this manner, growth of carbon nanotubes on a full wafer can be achieved while inhibiting unwanted characteristics, such as amorphous carbon deposits and oily coatings including hydrocarbons.

According to a more particular example embodiment of the present invention, patterned, individually addressable SWNTs are grown on a $SiO_2$/Si wafer and are adapted for use in one or more of a variety of electronic circuits. First, catalyst material is patterned into uniform catalyst islands (e.g., catalyst particles) on the wafer using a process such as deep ultra-violet (DUV) photolithography and spin casting. The patterned wafer is placed into a chamber and CVD is carried out at elevated temperatures using $CH_4$ and a co-flow gas that includes an amount of $H_2$ selected for the particular application. More specifically, the co-flow into the chamber is selected such that the $CH_4$ CVD results in carbon nanotube growth with the $H_2$ addition while inhibiting pyrolysis (e.g., deposition of amorphous carbon and/or generation of hydrocarbons) at the temperature in the chamber. This is particularly useful for avoiding difficulties in the nanotube growth process, including unwanted carbon deposits and oily coating in the chamber by hydrocarbons. In addition, the amount of $H_2$ co-flow enables the growth of high quality SWNTs from massive arrays (e.g., $10^7$–$10^8$) of well-defined surface sites on a full wafer.

Figure 1B:
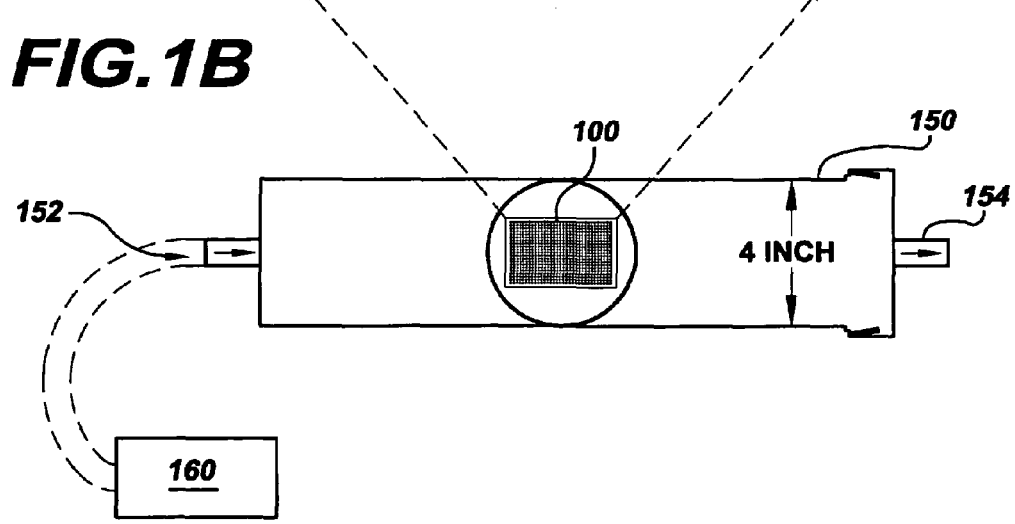
FIG. 1B is a diagram of a quartz-tube reactor used for growing nanotubes from the wafer shown in FIG. 1A, according to another example embodiment of the present invention.

FIGS. 1A and 1B show carbon nanotubes being grown on a 4" $SiO_2$/Si wafer 100 having an array of catalyst islands (e.g., particles of catalyst) used in forming the carbon nanotubes, according to another example embodiment of the present invention. The catalyst islands are formed using a patterned mask and a catalyst material deposited thereon. First, polymethylmethacrylate (PMMA) having a thickness of about 300 nm is deposited on the wafer. The wafer is then exposed through a quartz mask to DUV in a photolithography system, creating a PMMA layer having large arrays of wells therein. A suspension of $Al_2O_3$ supported Fe/Mo catalyst is spun onto the wafer at a low speed (e.g., about 250 rounds-per-minute) and the suspension fills the wells in the arrays. After the catalyst suspension is spun onto the wafer, the wafer is baked at about 160° C. and subsequently immersed in dichloroethane to lift off the PMMA, leaving the catalyst material behind. This leads to uniform catalyst arrays over the entire wafer, as shown in FIG. 1A, with each catalyst island having a size of about 1 micron.

In one implementation, a deposition arrangement 190 is adapted for forming the patterned array of catalyst islands. The deposition arrangement 190 may include, for example, photolithography systems, spin-coating arrangements and others, including components adapted for performing some or all of the processes discussed above (e.g., patterning, spin-coating, masking, baking and immersing). Equipment that may be adapted for implementation in connection with one or more example embodiments discussed herein may be available, for example, from Canon USA, Incorporated, Semiconductor Equipment Division of San Jose, Calif. and from DNS Electronics of Sunnyvale, Calif.

In FIG. 1B, the wafer 100 is then placed into a CVD chamber 150 for growing carbon nanotubes from the catalyst arrays. The CVD chamber includes a 4"-diameter (48" long heating zone) quartz tube furnace, and the furnace is heated to about 900° C. for about 10 min with the wafer placed therein. A carbon-containing gas including pure $CH_4$ (99.99%) at a fixed flow rate of 1500 ml/min is introduced to the furnace at inlet 152 and to provide carbon feedstock for the carbon nanotube growth. A co-flow gas including $H_2$ is also introduced to the furnace at inlet 152, with the amount of co-flow being selected to inhibit pyrolysis while achieving growth, as discussed herein. Excess reactants are exhausted from the furnace at outlet 154.

It has been discovered that strikingly different CVD growth results are obtained when varying the amount of $H_2$ flow during the CVD process. In one particular example embodiment, a suitable condition for yielding high quality SWNTs was discovered to include using 125 ml/min $H_2$ co-flow in the furnace 150 with the temperature and $CH_4$ gas conditions discussed above. Specifically, SWNTs are grown from patterned catalyst islands using co-flow, with several SWNTs emanating from the islands and extending to about 10 microns in length. These SWNTs are also useful in device integrations, and the growth from the catalyst islands across the entire 4" wafer is very consistent and uniform. Using this implementation, the $SiO_2$-wafer surface is generally clean without amorphous carbon deposits, indicating negligible $CH_4$ self-pyrolysis in the gas phase.

In one particular arrangement, a flow control arrangement 160 is adapted for supplying the carbon-containing gas and the $H_2$ co-flow to the CVD chamber 150. The flow arrangement 160 may include, for example, a controller such as a computer programmed for controlling the supply flow rate of the carbon-containing gas and the $H_2$ co-flow at an amount (e.g., gas ratio) that results in growth of carbon nanotubes, such as discussed above. In various implementations, the flow control arrangement 160 includes valves, meters and other commonly-available flow control devices.

Figure 2:
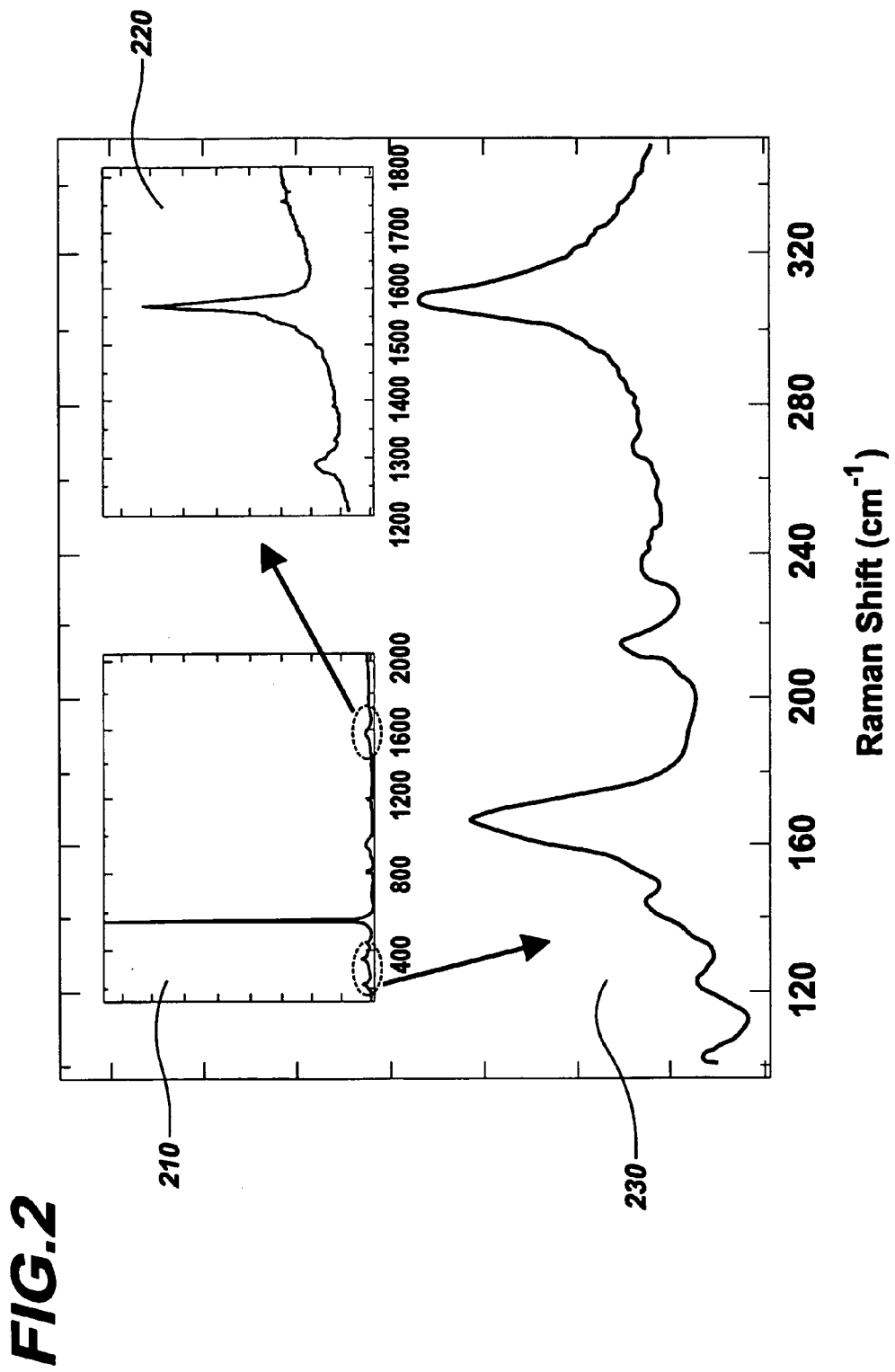
FIG. 2 is a Raman spectrum of carbon nanotubes growing from a catalyst island, according to another example embodiment of the present invention.

FIG. 2 shows example Raman spectra of carbon nanotubes growing off of a catalyst island, with spectrums 220 and 230 being enlarged views of portions of spectrum 210. Resonant micro-Raman spectroscopy (Renishaw) was performed using a 1-micron laser spot focused near the catalyst islands. Such spectra show very typical SWNT axial vibration modes around 1590 cm$^{-1}$ (enlarged spectrum 220) and radial breathing modes (RBM) around 120–320 cm$^{-1}$ (enlarged spectrum 230). High quality SWNTs (e.g., having diameters of about 1–3 nm and a RBM Raman shift of about 1/d) can be synthesized from the catalytic patterns.

Figure 3:
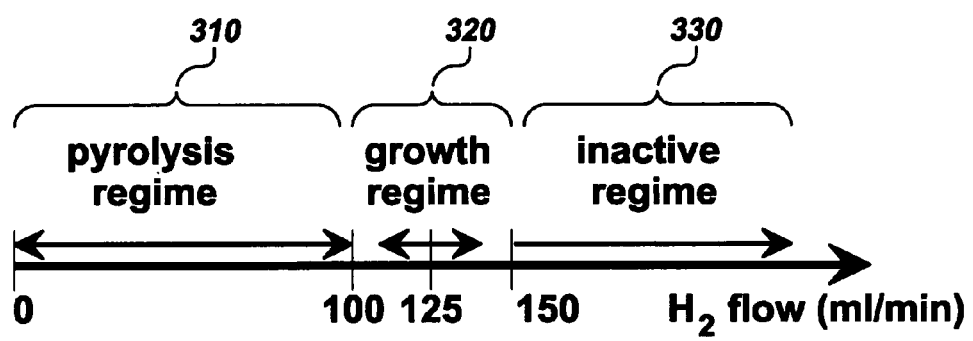
FIG. 3 is a schematic representation of three regimes of a CVD growth regime discovered in connection with another example embodiment of the present invention.

FIG. 3 shows example ranges of $H_2$ co-flow including a range 320 in which carbon nanotubes were discovered to grow, according to another example embodiment of the present invention. A co-flow of about 125 ml/min $H_2$ has been discovered to produce a desired growth-regime 320 when used in connection with a flow of about 1500 ml/min $CH_4$ at about 900° C. in a CVD chamber to achieve a clean surface and useful yield of SWNTs. Under these conditions, a pyrolysis-regime 310 exists when $H_2$ co-flow is lowered below about 100 ml/min, wherein few SWNTs are grown from catalyst islands. In this regime, AFM reveals the $SiO_2$-wafer surface to be covered by amorphous carbon. In contrast, an inactive-regime 330 is encountered when $H_2$ flow is increased above about 150 ml/min. By maintaining a $H_2$ co-flow of between about 100 and 150 ml/min, pyrolysis of the carbon is inhibited while avoiding an inactive growth regime. Once the growth regime 320 has been identified (e.g., using a test wafer), an amount of $H_2$ that maintains the growth regime while avoiding an inactive regime can be used for subsequent manufacturing under similar conditions, making possible wafer-scale fabrication of carbon nanotubes.

The three regimes of $CH_4$-CVD conditions parameterized by $H_2$ concentration under a constant $CH_4$ identified in FIG. 3 are selected for one particular implementation. However, the identification of such a growth regime is applicable to a variety of carbon nanotube growth conditions and arrangements. The chemical reactivity of $CH_4$ is sensitive to $H_2$, and this sensitivity is used to achieve a growth regime. The amount of $H_2$ introduced to the CVD chamber serves to decrease the rate of $CH_4$ decomposition by hydrogenating reactive carbon species. The presence of $H_2$ slows down $CH_4$ decomposition because $H_2$ is a product of the reaction. In the pyrolysis-regime, $CH_4$ decomposition is vigorous without effective $H_2$ inhibition and amorphous carbon generation causes catalyst poisoning and zero SWNT yield. In the inactive-regime, the concentration of $H_2$ lowers the $CH_4$ reactivity below a level needed for $CH_4$ as an efficient carbon feedstock to the catalyst. In the growth-regime, the concentration of $H_2$ allows a fine balance to prevent undesired amorphous carbon formation and maintain the $CH_4$ reactivity, leading to excellent results in catalytic SWNT growth.

The chemistry discussed in the example implementation above is useful for identifying highly reproducible and controllable growth conditions in a growth regime, which is useful for successful patterned SWNT growth on full 4" wafers. In one implementation, a growth regime is identified using a plurality of test wafers and subjecting the wafers to different amounts of $H_2$ co-flow under otherwise similar conditions. The wafers are monitored and used to identify pyrolysis, growth and inactive regimes, such as shown in FIG. 3. Once the regimes have been identified, a co-flow that corresponds to the growth regime is used to manufacture additional carbon nanotubes on wafers under the selected manufacturing conditions.

Furthermore, the example embodiments described herein are general, and the present invention is applicable to predicting growth conditions for different temperatures and flow rates of carbon containing gas, such as $CH_4$, and can be extended to CVD growth for multi-walled nanotubes. For instance, it has been discovered that, at 950° C., a growth-regime for SWNTs is identified with 1500 ml/min $CH_4$ flow and about 200 ml/min $H_2$ co-flow. This condition was discovered when increasing the $H_2$ concentration just beyond the pyrolysis-regime described above. It has also been discovered that, due to the reactivity of methane being higher at a higher temperature (950° C. vs. 900° C.), a higher concentration of $H_2$ (200 vs. 125 ml/min) is useful for inhibiting $CH_4$ decomposition and for bringing the system into the nanotube growth-regime.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, for example: modifying the nanotubes for selected applications, altering the arrangement and orientation of the nanotubes, adding other substances (e.g., boron and/or nitrogen) to the carbon-containing nanotubes, adding structures to the devices and where appropriate, using SWNTs as building blocks for more complex devices, such as MWNTs.

For general information regarding carbon nanotubes, and for specific information regarding implementations to which one or more of the approaches discussed herein may be applicable, reference may be made to the attached Appendix A, to U.S. Provisional Patent Application Ser. No. 60/335,30 , entitled "Integrated Nanotubes for Electronic Noses" and filed on Nov. 1, 2001; to U.S. patent application Ser. No. 10/285,305, entitled "Integrated Nanotube Sensor" and filed on Oct. 31, 2002 and to U.S. patent application Ser. No. 09/574,393, filed on May 19, 2000 and entitled "Carbon Nanotube Devices," now U.S. Pat. No. 6,528,020; which is a divisional of U.S. Pat. No. 6,346,189, filed on Aug. 14, 1998 and entitled "Carbon Nanotube Structures Made Using Catalyst Islands," and which claims priority to U.S. Provisional Application Ser. No. 60/171,200, filed on Dec. 15, 1999, all of which are fully incorporated herein by reference. Such modifications and changes do not depart from the spirit and scope of the present invention.

What is claimed is:

1. A method for growing a plurality of carbon nanotubes, the method comprising:

introducing a carbon-containing gas and $H_2$ to a wafer having an ordered, non-random array of catalyst particles and growing carbon nanotubes extending from the catalyst particles, the amount of $H_2$ being increased to a level sufficient for maintaining the reactivity of the carbon-containing gas for growing the carbon nanotubes while inhibiting pyrolysis of the carbon in the carbon-containing gas.

2. The method of claim 1, wherein introducing a carbon-containing gas and $H_2$ to the wafer includes introducing the carbon-containing gas and $H_2$ via separate means.

3. The method of claim 1, wherein introducing a carbon-containing gas includes introducing $CH_4$.

4. The method of claim 1, wherein growing carbon nanotubes includes using the catalyst to catalyze a reaction of the carbon-containing gas, the reaction having a carbon product that forms the carbon nanotubes.

5. The method of claim 1, wherein introducing $H_2$ includes introducing $H_2$ at a flowrate that inhibits amorphous carbon formation.

6. The method of claim 1, wherein introducing $H_2$ includes introducing $H_2$ at a flowrate that inhibits hydrocarbon generation.

7. The method of claim 1, wherein growing carbon nanotubes includes growing between about $10^6$ and $10^9$ carbon nanotubes in an array on a wafer.

8. The method of claim 1, wherein introducing a carbon-containing gas and $H_2$ to the wafer includes introducing a carbon-containing gas and $H_2$ to the wafer in a CVD chamber.

9. The method of claim 1, further comprising forming the array of catalyst particles.

10. The method of claim 9, wherein forming the array of catalyst particles comprises:
 coating the semiconductor wafer with a layer of photosensitive material susceptible to removal via photoexposure;
 exposing an array of regions of the photosensitive material through a mask;
 developing the exposed regions to remove portions of the photosensitive material and forming an array of wells therein;
 forming catalyst material in the wells;
 after forming the catalyst material, baking the wafer; and
 immersing the wafer in a solvent and removing at least a portion of the photosensitive material.

11. The method of claim 10, wherein coating the semiconductor wafer with a layer of photosensitive material comprises coating the semiconductor wafer with polymethylmethacrylate (PMMA).

12. The method of claim 11, wherein immersing the wafer in a solvent includes immersing the wafer in dichloroethane and removing at least a portion of the PMMA.

13. The method of claim 10, wherein forming a catalyst material in the wells includes spinning a suspension of catalyst material into the wells.

14. The method of claim 13, wherein spinning a suspension of catalyst material into the wells includes spinning a suspension of aluminum oxide supported by a catalyst into the wells.

15. The method of claim 10, wherein immersing the wafer in a solvent and removing at least a portion of the photosensitive material includes exposing the catalyst material in the wells and forming catalyst islands on the semiconductor wafer.

16. The method of claim 1, wherein forming a carbon nanotube includes forming a single-walled carbon nanotube.

17. The method of claim 1, wherein forming an array of catalyst particles on the wafer includes forming an array of catalyst particles on a wafer including silicon.

18. A method for identifying a growth regime for carbon nanotube growth on a wafer, the method comprising:
 patterning a catalyst material on a wafer;
 introducing a carbon-containing gas and $H_2$ to the wafer and growing carbon on the wafer, the $H_2$ being introduced at a selected flowrate;
 incrementing the $H_2$ flowrate while monitoring the carbon growth on the wafer; and
 in response to monitoring the carbon growth on the wafer, identifying a growth-regime $H_2$ flowrate range that achieves carbon growth while inhibiting carbon pyrolysis.

19. The method of claim 18, wherein introducing a carbon-containing gas and $H_2$ to the wafer includes introducing the carbon-containing gas and $H_2$ to the wafer in a heated CVD chamber.

20. The method of claim 18, wherein identifying a growth-regime $H_2$ flowrate range that achieves carbon growth while inhibiting carbon pyrolysis comprises:
 identifying a first $H_2$ flowrate range that results in pyrolysis;
 identifying a second $H_2$ flowrate range that results in inactive carbon nanotube growth; and
 identifying the growth-regime $H_2$ flowrate range as being between the first and second flowrate ranges.

21. The method of claim 18, wherein introducing a carbon-containing gas includes introducing $CH_4$.

22. A method for growing carbon nanotubes, the method comprising:
 patterning a catalyst material on a test wafer;
 introducing a carbon-containing gas and $H_2$ to the test wafer, the $H_2$ being introduced at a selected flowrate;
 incrementing the $H_2$ flowrate while monitoring the test wafer;
 identifying a $H_2$ flowrate range from the incremented flowrate that maintains carbon nanotube growth while inhibiting carbon pyrolysis;
 patterning a catalyst on a second wafer; and
 introducing a carbon-containing gas and $H_2$ to the second wafer, the $H_2$ being introduced at the identified flowrate range, and growing carbon nanotubes from the patterned catalyst on the second wafer.

23. The method of claim 22, wherein introducing a carbon-containing gas includes introducing $CH_4$.

24. The method of claim 22, further comprising repeating the steps of patterning a test wafer, introducing a carbon-containing gas and $H_2$ to the test wafer and incrementing the $H_2$ flowrate for a plurality of test wafers, wherein identifying a $H_2$ flowrate range from the incremented flowrate includes observing the plurality of test wafers and identifying a growth-regime range of wafers exhibiting carbon nanotube growth and inhibited pyrolysis and using the $H_2$ flowrate for each of the growth-regime range of wafers to identify the $H_2$ flowrate range that maintains carbon nanotube growth while inhibiting carbon pyrolysis.

25. The method of claim 1, wherein inhibiting pyrolysis of the carbon in the carbon-containing gas includes inhibiting pyrolysis of the carbon in the carbon-containing gas such that pyrolysis in the gas phase is negligible.

26. The method of claim 1, wherein the amount of $H_2$ is increased to a level sufficient for maintaining the reactivity of the carbon-containing gas for growing the carbon nanotubes while inhibiting pyrolysis of the carbon by identifying a growth-regime $H_2$ flowrate range that achieves carbon growth while inhibiting carbon pyrolysis and incrementing the $H_2$ flowrate to the identified growth-regime.

* * * * *

UNITED STATES PATENT AND TRADEMARK OFFICE
CERTIFICATE OF CORRECTION

PATENT NO.       : 7,183,228 B1
APPLICATION NO.  : 10/285311
DATED            : February 27, 2007
INVENTOR(S)      : Dai et al.

Page 1 of 1

It is certified that error appears in the above-identified patent and that said Letters Patent is hereby corrected as shown below:

Col. 6, line 32: "60/335,30" should read --60/335,306--.

Signed and Sealed this

Ninth Day of September, 2008

JON W. DUDAS
*Director of the United States Patent and Trademark Office*